United States Patent
Lin et al.

(10) Patent No.: US 12,029,046 B2
(45) Date of Patent: Jul. 2, 2024

(54) MAGNETIC TUNNELING JUNCTION (MTJ) ELEMENT WITH AN AMORPHOUS BUFFER LAYER AND ITS FABRICATION PROCESS

(71) Applicant: Taiwan Semiconductor Manufacturing Company, Ltd., Hsin-Chu (TW)

(72) Inventors: Tsann Lin, Hsinchu (TW); Chien-Min Lee, Hsinchu County (TW); Ji-Feng Ying, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 322 days.

(21) Appl. No.: 17/388,394

(22) Filed: Jul. 29, 2021

(65) Prior Publication Data

US 2021/0359002 A1    Nov. 18, 2021

Related U.S. Application Data

(62) Division of application No. 16/372,792, filed on Apr. 2, 2019, now Pat. No. 11,088,201.

(60) Provisional application No. 62/692,285, filed on Jun. 29, 2018.

(51) Int. Cl.
| | |
|---|---|
| *H10B 61/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ............. *H10B 61/22* (2023.02); *H10N 50/01* (2023.02); *H10N 50/10* (2023.02); *H10N 50/80* (2023.02); *H10N 50/85* (2023.02)

(58) Field of Classification Search
CPC .......... G11C 2211/5615; G11C 11/161; H10B 61/00–22; H10N 50/10; H10N 50/80; H10N 50/85; H10N 59/00
See application file for complete search history.

(56) References Cited

U.S. PATENT DOCUMENTS

| 6,544,801 B1 | 4/2003 | Slaughter et al. |
|---|---|---|
| 7,149,105 B2 | 12/2006 | Brown et al. |
| 9,177,575 B1 | 11/2015 | Gao et al. |
| 10,032,828 B2 | 7/2018 | Chuang et al. |

(Continued)

OTHER PUBLICATIONS

Non-Final Office Action dated Aug. 24, 2020 for U.S. Appl. No. 16/372,792.

(Continued)

*Primary Examiner* — Tucker J Wright
(74) *Attorney, Agent, or Firm* — Eschweiler & Potashnik, LLC

(57) ABSTRACT

Some embodiments relate to a method for manufacturing a memory device. The method includes forming a bottom electrode layer over a substrate. A first etch process is performed, thereby defining one or more holes in the bottom electrode layer and defining a bottom electrode. A pair of insulators are formed within the one or more holes such that the insulators are disposed on opposing sides of the bottom electrode. A buffer layer, a seed layer, a magnetic tunnel junction (MTJ) stack, and a top electrode are formed over the bottom electrode. A second etch process is performed to remove a portion of the buffer layer, the seed layer, the MTJ stack, and the top electrode, thereby defining a memory cell.

20 Claims, 9 Drawing Sheets

(56) References Cited

U.S. PATENT DOCUMENTS

| | | |
|---|---|---|
| 2005/0195532 A1 | 9/2005 | Sugiyama et al. |
| 2007/0275269 A1 | 11/2007 | Takahoshi et al. |
| 2011/0303998 A1 | 12/2011 | Ranjan et al. |
| 2012/0032287 A1 | 2/2012 | Li et al. |
| 2012/0069472 A1 | 3/2012 | Lin |
| 2015/0340600 A1 | 11/2015 | Kim et al. |
| 2016/0049584 A1 | 2/2016 | Dang et al. |
| 2016/0125925 A1 | 5/2016 | Meng et al. |
| 2016/0155932 A1 | 6/2016 | Chen et al. |
| 2018/0040809 A1 | 2/2018 | Monn |
| 2019/0305210 A1 | 10/2019 | Tahmasebi et al. |

OTHER PUBLICATIONS

Final Office Action dated Nov. 30, 2020 for U.S. Appl. No. 16/372,792.
Notice of Allowance dated Apr. 7, 2021 for U.S. Appl. No. 16/372,792.

MAGNETIC TUNNELING JUNCTION (MTJ) ELEMENT WITH AN AMORPHOUS BUFFER LAYER AND ITS FABRICATION PROCESS

REFERENCE TO RELATED APPLICATIONS

This application is a Divisional of U.S. application Ser. No. 16/372,792, filed on Apr. 2, 2019, which claims the benefit of U.S. Provisional Application No. 62/692,285, filed on Jun. 29, 2018. The contents of the above-referenced patent applications are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or RAM, and thus are promising candidates for next generation memory solutions. A magnetic random access memory (MRAM) device is currently explored to facilitate a static random access memory (SRAM) to own a high non-volatile storage density. The MRAM device includes an array of densely packed MRAM cells. In each MRAM cell, a magnetic tunneling junction (MTJ) element is integrated with a transistor to perform write and read operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
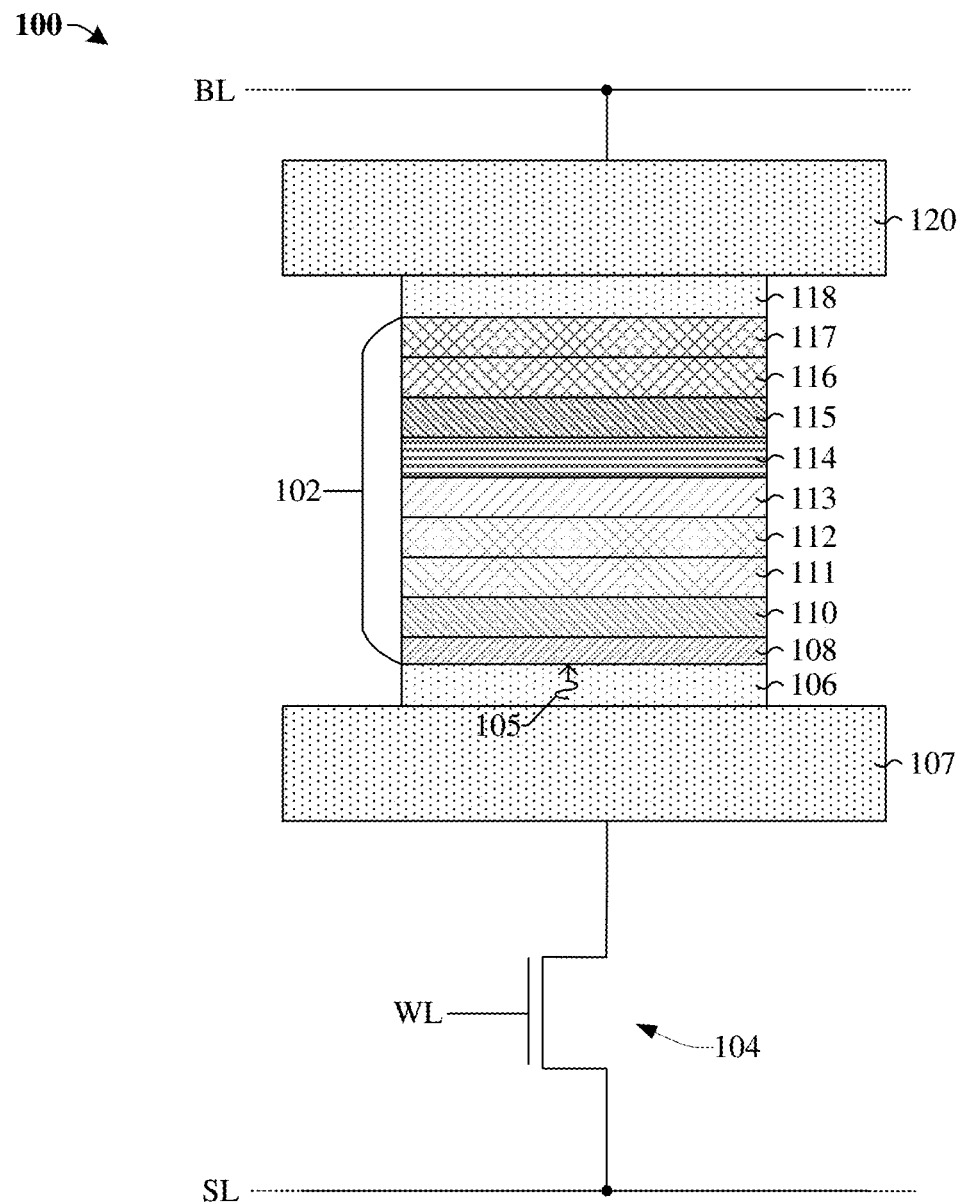
FIG. 1 illustrates a schematic view of some embodiments of a memory device including a magnetic tunneling junction (MTJ) element, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) stack includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, it is more likely that electrons will tunnel through the tunnel barrier layer, such that the MTJ stack is in a low-resistance state. Conversely, if the magnetization directions of the reference layer and free layer are in an anti-parallel orientation, it is less likely that electrons will tunnel through the tunnel barrier layer, such that the MTJ stack is in a high-resistance state. Consequently, the MTJ stack can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). Because of this binary nature, MTJ stacks are used in memory cells to store digital data, with the low resistance state $R_P$ corresponding to a first data state (e.g., logical "0"), and the high-resistance state $R_{AP}$ corresponding to a second data state (e.g., logical "1").

Typically, an MTJ stack is disposed between a bottom electrode and a top electrode, and the reference layer, free layer, and tunnel barrier layer are manufactured to have a specific crystalline structure and orientation. Specifically, the reference layer is made with a body-centered-cubic (bcc) structure with (100) orientation. In other embodiments, the reference layer is made with a face-center-cubic (fcc) structure with (111) orientation. To ensure the reference layer has this structure and orientation, the MTJ stack is grown from a seed layer. However, as appreciated in some aspects of the present disclosure, conventional seed layers and/or bottom electrodes include a diffusive species, such as tantalum (Ta) and/or ruthenium (Ru). This diffusive species is prone to diffuse from the seed layer and/or bottom electrode into the tunnel barrier layer, adversely affecting the tunnel magnetoresistance (TMR) effect, especially over thermal stress and aging. The current disclosure appreciates that a roughness on the bottom electrode surface is also a major source of MTJ performance degradation. If the bottom electrode surface can be made smoother (planarized better), the TMR effect can be significantly improved.

Some embodiments of the present disclosure relate to an MTJ device comprising a bottom electrode, a conductive seed layer over the bottom electrode, an MTJ stack over the conductive seed layer, and a top electrode over the MTJ stack. A buffer layer separates the conductive seed layer from the bottom electrode. This buffer layer is configured to prevent diffusion of a diffusive species, such as tantalum and/or ruthenium, from the bottom electrode into the conductive seed layer and into the MTJ stack. For example, it is thought that the buffer layer helps the conductive seed layer and MTJ stack grow so as to reduce the presence of small imperfections (e.g., grain boundaries) in the MTJ stack. Thus, by limiting imperfections in the conductive seed layer and MTJ stack, the buffer layer helps prevent the diffusive species (e.g., Ta and/or Ru) from diffusing from the bottom electrode into the tunnel barrier layer of the MTJ stack. Further, because the buffer layer improves the crystalline structure of the MTJ stack, diffusion for layers containing diffusive species above the buffer layer is also reduced. For example, even if the seed layer and/or a hard-bias layer above the buffer layer includes a diffusive species (e.g., Ta or Ru), the fact that the seed layer and/or hard-bias layer were formed over the buffer layer (and not directly on an underlying bottom electrode) limits imperfections in the lattice of the seed layer and MTJ stack and consequently limits diffusion of the diffusive species into the tunnel barrier layer. This prevents the diffusive species from adversely affecting a TMR of the MTJ stack, and prevents the degradation of the MTJ performance. The insertion of the buffer layer also provides a smoother top surface to aid the formation of the seed layer and MTJ stack. In some embodiments, the buffer layer is made of an amorphous nonmagnetic film of the form X—Y (where X is iron (Fe), cobalt (Co), or the like, and Y is hafnium (Hf), yttrium (Y), zirconium (Zr), or the like), and is preferably formed of a Co—Hf film with a Hf content ranging from approximately 18 atomic percentage (at %) to 40 at %, and a thickness ranging from approximately 1 nanometer to approximately 10 nanometers. For example a Co—Hf alloy film with Hf content of 18 at % would have 18 percent of the number of atoms in the Co—Hf alloy film as Hf and 82 percent of the number of atoms in the Co—Hf alloy film as Co.

Referring to FIG. 1, a schematic view of a memory device 100 in accordance with some embodiments is provided. The memory device 100 includes a magnetic tunnel junction (MTJ) stack 102 and an access transistor 104. The access transistor is coupled to the MTJ stack 102 by a first metal wire 107 disposed under a bottom electrode 106. A bitline (BL) is coupled to one end of the MTJ stack 102 through a top electrode 118 disposed under a second metal wire 120, and a sourceline (SL) is coupled to an opposite end of the MTJ stack 102 through the access transistor 104. Thus, application of a suitable wordline (WL) voltage to a gate electrode of the access transistor 104 couples the MTJ stack 102 between the BL and the SL. Consequently, by providing suitable bias conditions, the MTJ stack 102 can be switched between two states of electrical resistance, a first state with a low resistance (magnetization directions of reference layer and free layer are parallel) and a second state with a high resistance (magnetization directions of reference layer and free layer are antiparallel), to store data.

The MTJ stack 102 is disposed between the bottom electrode 106 and the top electrode 118. In some embodiments, the MTJ stack 102 comprises a buffer layer 108 (in some embodiments referred to as a diffusion barrier layer), a seed layer 110, a hard bias stack 111, an anti-parallel coupling (APC) layer 112, a reference layer 113, a barrier layer 114, a free layer 115, a perpendicular magnetic anisotropy (PMA) protection layer 116, and a capping layer 117. The capping layer 117 is disposed over the PMA protection layer 116. In some embodiments, the APC layer 112 is optional and not a part of the MTJ stack 102. In some embodiments, the APC layer 112 is a part of the hard bias stack 111 where it is included in the hard bias stack 111 as a top layer of the hard bias stack 111. In some embodiments, the capping layer 117 is optional and not a part of the MTJ stack 102. In some embodiments, the capping layer 117 is part of the PMA protection layer 116 where it is included in the PMA protection layer 116 as a top layer of the PMA protection layer 116. In some embodiments, the bottom electrode 106 is comprised of tantalum (Ta), tantalum nitride (TaN), or ruthenium (Ru), for example. In some embodiments, an upper surface of the bottom electrode 106 is substantially rough. For example, the substantially rough upper surface of the bottom electrode 106 may comprise a plurality of protrusion, have a saw-toothed profile, and/or some other suitable profile.

The buffer layer 108 is non-magnetic and conductive and is configured to prevent diffusion 105 of the diffusive species from the bottom electrode 106 to the seed layer 110, hard bias stack 111, APC layer 112, reference layer 113, and barrier layer 114. Thus, the buffer layer 108 prevents or limits the diffusive species from diffusing into the barrier layer 114, which keeps the barrier layer 114 from electrically "leaking" between the reference layer 113 and the free layer 115. In some embodiments, the buffer layer 108 is made of an amorphous nonmagnetic film of the form X—Y (where X is Fe, Co, etc., and Y is Hf, Y, Zr, etc.). In some embodiments, a chemical content of a Co—Hf film with an Hf content ranging from 18 at % to 40 at %. In some embodiments, the buffer layer 108 has a thickness ranging between approximately 1 nanometer and approximately 10 nanometers. The buffer layer 108 has a smooth surface and is amorphous, and provides an atomic structural foundation for the seed layer 110, hard bias stack 111, APC layer 112, reference layer 113, barrier layer 114, free layer 115, and PMA protection layer 116 and capping layer 117 to achieve their desired atomic structure and orientation. Specifically, the buffer layer 108 ensures the hard bias stack 111 achieves a bcc structure with (100) orientation and to be a highly textured, large-grain crystalline structure that is substantially free of grain boundaries within one MRAM cell. In some embodiments, the buffer layer 108 is amorphous material made up of particles having an average diameter of less than 1 nm, and provides a structural foundation for the reference layer 113 to achieve a bcc structure with (100) orientation. In other embodiments, the buffer layer 108 ensures the hard bias stack 111 achieves a face-center-cubic (fcc) structure with (111) orientation. In yet further embodiments, the buffer layer 108 facilitates the reference layer 113 achieving an fcc structure with (111) orientation.

The seed layer 110 is disposed directly above the buffer layer 108. The seed layer 110 has a smooth surface and is amorphous. In some embodiments, the seed layer 110 is comprised of a multilayer stack with layers including materials such as nickel chromium (NiCr), cobalt iron boron (CoFeB), magnesium (Mg), tantalum (Ta), ruthenium (Ru), or the like, where each layer is respectively formed with a thickness of 5 nanometers or within a range of approximately 4 nanometers and 6 nanometers.

The hard bias stack 111 is a ferromagnetic material having a magnetization direction that is constrained or "fixed". This "fixed" magnetization direction can be achieved in some cases by an initializing exposure to a high magnetic field after the entire chip is manufactured.

The reference layer 113 is a ferromagnetic layer that has a magnetization direction that is "fixed". However, the magnetization direction of the reference layer 113 is opposite to that of the hard bias stack 111. For example, if the magnetization direction of the hard bias stack 111 is "up", the magnetization of the reference layer 113 is "down"; or if the magnetization direction of the hard bias stack 111 is "left" (in plane within the hard bias stack 111), the magnetization of the reference layer 113 is "right" (in plane within the reference layer 113, but again opposite to that of the hard bias stack 111). The APC layer 112 ensures that the magnetization of the reference layer 113 is the opposite that of the hard bias stack 111 through exchange bias coupling effect. In some embodiments, the APC layer 112 is made of Ru formed to a thickness of 0.4 nanometers or within a range of approximately 0.3 nanometers to approximately 0.5 nanometers or iridium (Ir) formed to a thickness of 0.5 nanometers or within a range of approximately 0.4 nanometers to approximately 0.6 nanometers.

The barrier layer 114, which can manifest as a thin dielectric layer or non-magnetic metal layer in some cases, separates the reference layer 113 from the free layer 115. In some embodiments, the barrier layer 114 can comprise an amorphous barrier, such as aluminum oxide ($AlO_x$) or titanium oxide ($TiO_x$), or a crystalline barrier, such as manganese oxide (MgO) or a spinel (e.g., $MgAl_2O_4$). In embodiments where the ferromagnetic memory stack is an MTJ, the barrier 114 is a tunnel barrier which is thin enough to allow quantum mechanical tunneling of current between the reference layer 113 and the free layer 115.

The free layer 115 is capable of changing its magnetization direction between one of two magnetization states, which correspond to binary data states stored in a memory cell. For example, in a first state, the free layer 115 can have a magnetization direction in which the magnetization of the free layer 115 is aligned in parallel with the magnetization direction of the reference layer 113, thereby providing the MTJ stack 102 with a relatively low resistance. In a second state, the free layer 115 can have a magnetization direction which is aligned anti-parallel with the magnetization direction of the ferromagnetic reference layer 113, thereby providing the MTJ stack 102 with a relatively high resistance.

The PMA protection layer 116 is disposed over the free layer 115. The PMA protection layer 116 often enhances anisotropy for the MTJ stack 102, or protects it from degrading when the stack is built up. The capping layer 117 is disposed over the PMA protection layer 116.

Because the buffer layer 108 helps to form a crystalline structure with fewer defects in the film stack above it, the buffer layer 108, in effect, prevents diffusion 105 of the diffusive species from the bottom electrode 106 to the seed layer 110 and to the MTJ stack 102, the MTJ stack 102 may hence exhibit higher reliability and better crystalline structure than conventional approaches.

Figure 2A:
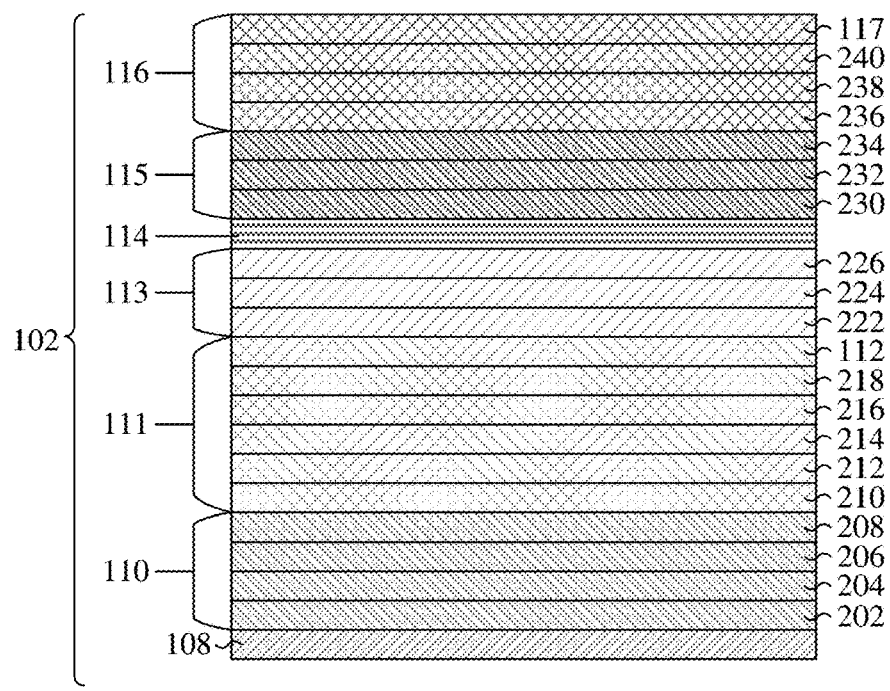
FIGS. 2A, 2B, and 2C illustrate cross-sectional views of some embodiments of an MTJ element, according to the present disclosure.

Referring to FIG. 2A, a cross-sectional view of an MTJ device 200a in accordance with some embodiments is provided. The MTJ device 200a includes a detailed breakout of the layers comprised in the MTJ stack 102 from FIG. 1. A buffer layer 108 is disposed below a seed layer 110. The buffer layer 108 facilitates layers above it to achieve their desired crystalline structure and orientation, additionally the buffer layer 108 does not disrupt the magnetic interactions of layers above it. The buffer layer 108 has a smooth morphology, is non-magnetic and conductive, substantially free of diffusive species (e.g., free of Ru and Ta), and is either amorphous (e.g., average grain diameter of less than 1 nm) or has a strong (100) orientated bcc structure. The buffer layer 108 acts as a diffusion barrier to prevent diffusion of metal material into the hard bias stack 111 and MTJ stack 102. The buffer layer 108 provides an atomic structure that provides a foundation for the hard bias stack 111 to achieve a bcc structure with (100) orientation. In some embodiments, the buffer layer 108 is made of an amorphous nonmagnetic film of the form X—Y (where X is Fe, Co, etc., and Y is Hf, Y, Zr, etc.). In some embodiments, the buffer layer 108 is a Co—Hf film with an Hf content ranging from 18 at % to 40 at %. In some embodiments, the buffer layer can have a thickness ranging between approximately 1 nm and 10 nm.

The seed layer 110 is disposed directly above the buffer layer 108. It will be appreciated that seed layers can include any number of layers in any order with many allowable materials and thus FIG. 2A is merely an example. The seed layer 110 has a smooth surface and is amorphous. In some embodiments, the seed layer 110 comprises a tantalum nitride (TaN) layer 202 disposed under a magnesium (Mg) layer 204, a cobalt iron boron (CoFeB) layer 206 disposed over the Mg layer 204, and a nickel chromium (NiCr) layer 208 disposed over the CoFeB layer 206. In some embodiments, the seed layer 110 is comprised of a multilayer stack with layers including materials such as nickel chromium (NiCr), cobalt iron boron (CoFeB), magnesium (Mg), and/or tantalum (Ta). In some embodiments, individual layers within the seed layer 110 are respectively formed to a thickness of 5 nm, within a range of approximately 4 nm to 6 nm, or within a range of approximately 0.25 nm to 1.5 nm. In some embodiments, the seed layer 110 comprises ruthenium with a thickness of 5 nm and/or a thickness within a range of 4.5 nm to 5.5 nm.

The hard bias stack 111 has strong anisotropy. In some embodiments, the hard bias stack 111 comprises a laminated structure of N repeats of alternating layers of Co and platinum (Pt). In some embodiments, N is a whole number greater than one, in some embodiments N is 5, in alternative embodiments N is within a range of approximately 5 and 20, or some other suitable number. In some embodiments, above the hard bias stack 111 there is an antiparallel coupling (APC) layer 112. It will be appreciated that hard bias stack 111 can include any number of layers in any order with many allowable materials and thicknesses, and thus FIG. 2A is merely an example. The hard bias stack 111 comprises a first hard bias layer 210 disposed over the NiCr layer 208, a second hard bias layer 212 disposed over the first hard bias layer 210, a first cobalt (Co) layer 214 over the second hard bias layer 212, a third hard bias layer 216 disposed over the first Co layer 214, and a second cobalt (Co) layer 218 disposed over the third hard bias layer 216. In some embodiments, the first hard bias layer 210 is comprised of cobalt nickel (CoNi), cobalt palladium (CoPd) or cobalt platinum (CoPt), or the first hard bias layer 210 is comprised of a multilayer stack of the aforementioned materials. In some embodiments, the second hard bias layer 212 is comprised of nickel (Ni), palladium (Pd), or platinum (Pt). In some embodiments, the third hard bias layer 216 is comprised of nickel (Ni), palladium (Pd), or Pt. The APC layer 112 provides antiferromagnetic indirect exchange coupling between layers of the hard bias stack 111 and reference layer 113 of the MTJ stack 102. In some embodiments, layers within the hard bias stack 111 are respectively formed to a thickness of 0.3 nm or within a range of 0.2 nm to 0.4 nm. In some embodiments, the APC layer 112 is comprised of Ru formed to a thickness of 0.4 nm or within a range of approximately 0.3 nm to 0.5 nm, or Ir formed to a thickness of 0.5 nm or within a range of approximately 0.4 nm to 0.6 nm.

The MTJ stack 102 comprises a free layer 115 disposed over a barrier layer 114, and a reference layer 113. It will be appreciated that free layer 115 and/or reference layer 113 can include any number of layers in any order with many allowable materials and thicknesses, and thus FIG. 2A is merely an example. The reference layer 113 comprises a first cobalt iron boron (CoFeB) layer 222 disposed over the APC layer 112, a first reference layer 224 disposed over the first CoFeB layer 222, and a second CoFeB layer 226 disposed over the first reference layer 224. In some embodiments, the first reference layer 224 comprises molybdenum (Mo) or tungsten (W). In some embodiments, the barrier layer 114 comprises magnesium oxide (MgO). In some embodiments, layers within the reference layer 113 are respectively formed to a thickness of 0.3 nm, 0.8 nm, 1 nm, or within a range of 0.15 nm to 1.5 nm. The free layer 115 comprises a third CoFeB layer 230 disposed over the barrier layer 114, a first free layer 232 disposed over the third CoFeB layer 230, and a fourth CoFeB layer 234 disposed over the first free layer 232. In some embodiments, the first free layer 232 comprises molybdenum (Mo) or tungsten (W). In some embodiments, layers within the free layer 115 are respectively formed to a thickness of 0.2 nm, 1 nm, or within a range of 0.10 nm to 1.5 nm. The APC layer 112 causes antiparallel coupling between the hard bias stack 111 and reference layer 113.

The MTJ stack 102 includes the reference layer 113 and the free layer 115, which are separated from one another by the barrier layer 114. In some embodiments, the reference layer 113 can have a fixed or "pinned" magnetic orientation, while the free layer 115 has a variable or "free" magnetic orientation, which can be switched between two or more distinct magnetic polarities that each represents a different data state, such as a different binary state.

In some embodiments, the free layer 115 comprises iron, cobalt, nickel, iron cobalt, nickel cobalt, cobalt iron boride, iron boride, iron platinum, iron palladium, or the like. In some embodiments, the barrier layer 114 provides electrical isolation between the free layer 115 and the reference layer 113, while still allowing electrons to tunnel through the barrier layer 114 under proper conditions. The barrier layer 114 may comprise, for example, magnesium oxide (MgO), aluminum oxide (e.g., $Al_2O_3$), nickel oxide, gadolinium oxide, tantalum oxide, molybdenum oxide, titanium oxide, tungsten oxide, or the like.

The PMA protection layer 116 is disposed over the MTJ stack 102. It will be appreciated that the PMA protection layer 116 can include any number of layers in any order with many allowable materials and thicknesses and thus FIG. 2A is merely an example. The PMA protection layer 116 enhances the anisotropy of the MTJ stack 102. The PMA protection layer 116 comprises a capping magnesium oxide (MgO) layer 236 disposed over the fourth CoFeB layer 234, a capping CoFeB layer 238 disposed over the capping MgO layer 236, a first capping layer 240 disposed over the capping CoFeB layer 238, and the capping layer 117 disposed over the first capping layer 240. In some embodiments, the first capping layer 240 comprises molybdenum (Mo) or tungsten (W). In some embodiments, layers within the PMA protection layer 116 are respectively formed to a thickness of 0.4 nm, 0.6 nm, 2 nm, or within a range of 0.2 nm to 3 nm. In some embodiments, the capping layer 117 comprises ruthenium (Ru) formed to a thickness of 6 nm or within a range of 3 nm and 9 nm, which prevents diffusion of a diffusive species to the MTJ stack 102.

Figure 2B:
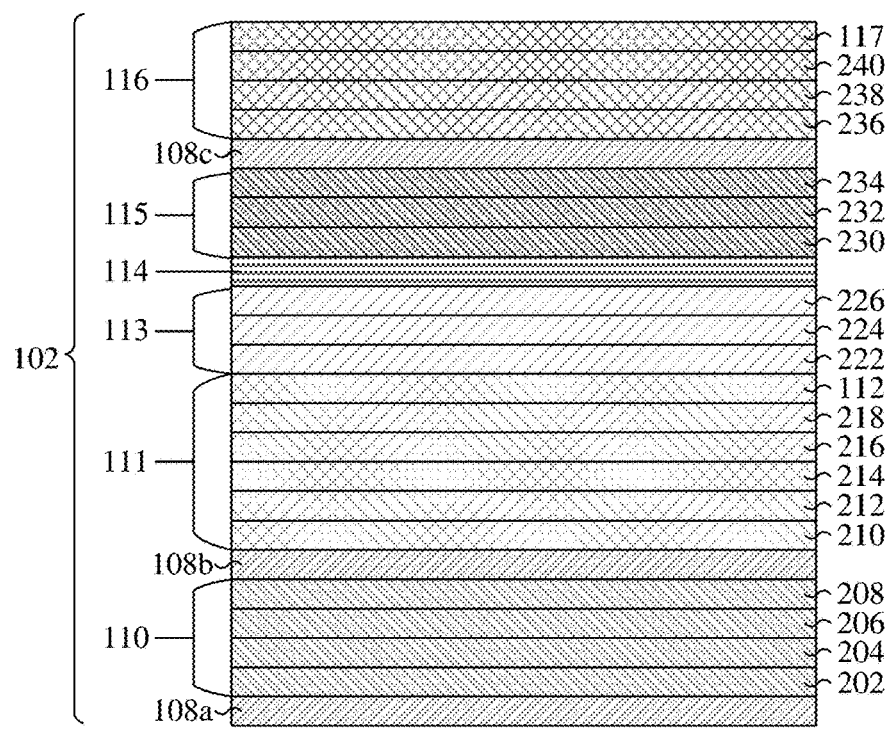

Referring to FIG. 2B, a cross-sectional view of an MTJ device 200b in accordance with some embodiments is provided. The MTJ device 200b includes a detailed breakout of the layers comprised in an additional embodiment of the MTJ stack 102 from FIG. 1. A buffer layer 108a is disposed below a seed layer 110. A buffer layer 108b is disposed between the seed layer 110 and the hard bias stack 111. A buffer layer 108c is disposed between the free layer 115 and the PMA protection 116. The buffer layers 108a, 108b, and 108c have smooth morphologies, are non-magnetic and conductive, substantially free of diffusive species themselves, and amorphous. The buffer layers 108a, 108b, and 108c act as diffusion barriers to prevent diffusion of metal material (such as tantalum (Ta) and/or ruthenium (Ru)) into the hard bias stack 111 and MTJ stack 102. The buffer layer 108a provides an atomic structural foundation for the hard bias stack 111 to achieve an bcc structure with (100) orientation. In some embodiments, the buffer layers 108a, 108b, and 108c are respectively made of an amorphous nonmagnetic film of the form X—Y (where X is Fe, Co, etc., and Y is Hf, Y, Zr, etc.), within a range of thickness between approximately 1 nm and 10 nm. In some embodiments, the buffer layers 108a, 108b, and 108c are respectively made of a Co—Hf film with an Hf content ranging from 18 at % to 40 at %.

Figure 2C:
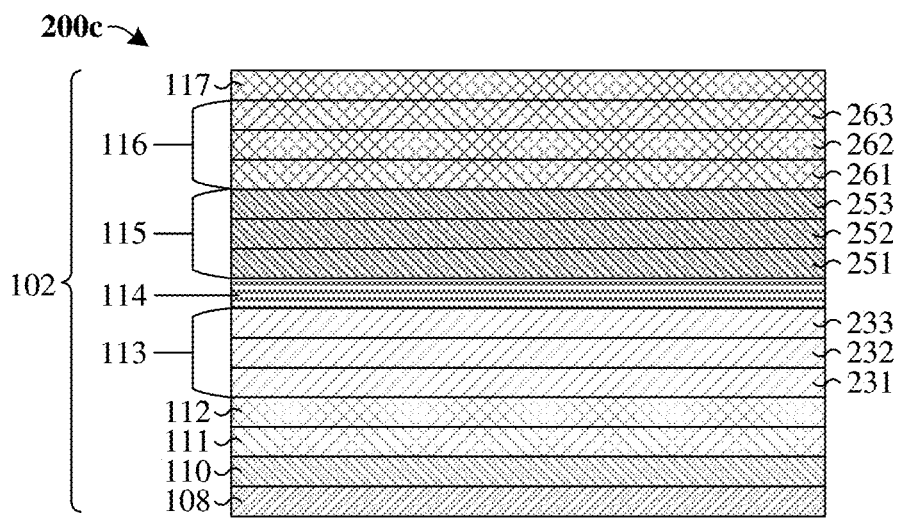

Referring to FIG. 2C, a cross-sectional view of an MTJ device 200c in accordance with some embodiments is provided. The MTJ device 200c includes a detailed breakout of the layers in an additional embodiment of the MTJ stack 102 from FIG. 1. The seed layer 110 is disposed directly above the buffer layer 108. The seed layer 110 has a smooth surface and is amorphous. In some embodiments, the seed layer 110 is comprised of Ru with a thickness of 5 nm or within a range of approximately 2.5 nm to 7.5 nm. The hard bias stack 111 has strong anisotropy. The hard bias stack 111 comprises a laminated structure of many repeats of alternating layers of Co and Pt. In some embodiments, layers of the hard bias stack 111 respectively have a thickness of 0.3 nm or within a range of approximately 0.15 nm to 0.45 nm. Above the hard bias stack 111 there is an antiparallel coupling (APC) layer 112. The APC layer 112 provides antiferromagnetic indirect exchange coupling between layers of the hard bias stack 111 and reference layer 113 of the MTJ stack 102. In some embodiments, the APC layer 112 is comprised of a ruthenium (Ru) layer having a thickness of 0.4 nm or an Ir layer having a thickness of 0.5 nm. The reference layer 113 comprises a CoFeB layer 231 having a thickness of 0.8 nm, a W layer 232 having a thickness of 0.3 nm and a FeB layer 233 having a thickness of 1.0 nm. In some embodiments, the barrier layer 114 comprises magnesium oxide (MgO) having a thickness of 0.8 nm. The free layer 115 comprises a CoFeB layer 251 having a thickness of 1.0 nm, a Mo layer 252 having a thickness of 0.2 nm, and a CoFeB layer 253 having a thickness of 1.0 nm. The APC layer 112 causes antiparallel coupling between the hard bias stack 111 and reference layer 113. The PMA protection layer 116 comprises an MgO layer 261 having a thickness of 0.6 nm, a CoFeB layer 262 having a thickness of 0.4 nm and a Mo layer 263 having a thickness of 2 nm. A capping layer 117 is disposed over the PMA protection layer 116. In some embodiments, the capping layer 117 comprises a Ru layer having a thickness of 6.0 nm, which prevents diffusion of a diffusive species to the MTJ stack 102.

Figure 3:
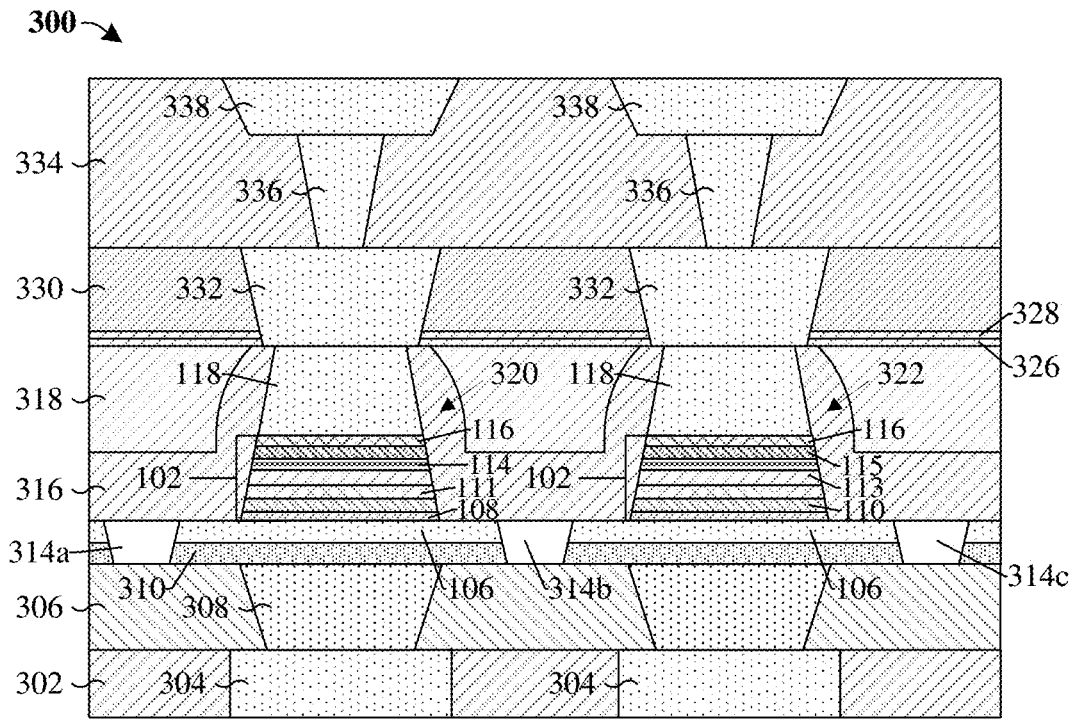
FIG. 3 illustrates a cross-sectional view of some embodiments of a memory device including two magnetic random access memory (MRAM) cells each having an MTJ element, according to the present disclosure.

FIG. 3 illustrates a cross sectional view of some embodiments of a memory device 300, which includes MRAM cells 320, 322. The memory device includes a lower metal wire 304 disposed within a first inter-level dielectric (ILD) layer 302. A second ILD layer 306 disposed over the first ILD layer 302. A lower interconnect via 308 disposed over the lower metal wire 304. A diffusion barrier 310 disposed over the lower interconnect via 308. A bottom electrode 106 disposed over the diffusion barrier 310. Insulators 314a, 314b, and 314c disposed over the second ILD layer 306. In some embodiments, the bottom electrode 106 is comprised of a titanium nitride (TiN) layer and/or a tantalum nitride (TaN) layer. In some embodiments, the lower interconnect via 308 and the metal wire 304 are comprised of copper or aluminum, for example.

The first and second MRAM cells 320, 322 are disposed between the bottom electrode 106 and a top electrode 118. The first and second MRAM cells 320, 322 comprise an MTJ stack 102. The MTJ stack 102 includes a buffer layer 108, a seed layer 110 over the buffer layer 108, a hard bias stack 111 over the seed layer 110, a reference layer 113 over the hard bias stack 111, a barrier layer 114 over the reference layer 113, a free layer 115 over the barrier layer 114, and a PMA protection layer 116 over the free layer 115. The buffer layer 108 is disposed between the bottom electrode 106 and the seed layer 110. The buffer layer 108 prevents diffusion of a diffusive species (such as Ta or Ru) from the bottom electrode 106 to the seed layer 110. In some embodiments, outer most sidewalls of the buffer layer 108 are within outermost sidewalls of the lower interconnect via 308. Outermost sidewalls of the buffer layer 108 are within outermost sidewalls of the bottom electrode 106. Sidewalls of the bottom electrode 106 and the diffusion barrier 310 below the first MRAM cell 320 are defined by an outer sidewall of the insulators 314a, 314b. Sidewalls of the bottom electrode 106 and the diffusion barrier 310 below the second MRAM cell 322 are defined by an outer sidewall of the insulators 314b, 314c. A width of a top surface of the insulators 314a, 314b, and 314c is greater than a width of a bottom surface of the insulators 314a, 314b, and 314c.

A sidewall spacer 316 is disposed over the first and second MRAM cells 320, 322. The sidewall spacer 316 covers sidewalls of the MTJ stack 102. In some embodiments, the sidewall spacer 316 is comprised of silicon nitride ($Si_3N_4$). A second ILD layer 318 is disposed over the sidewall spacer 316. In some embodiments, the second ILD layer 318 is comprised of a tetra-ethyl-ortho-silicate (TEOS) layer. A first dielectric layer 326 is disposed over the second ILD layer 318. In some embodiments, the first dielectric layer 326 is comprised of a silicon carbide (SiC) layer. A second dielectric layer 328 is disposed over the first dielectric layer 326. In some embodiments, the second dielectric layer 328 is comprised of a TEOS layer. A third ILD layer 330 is disposed over the second dielectric layer 328. A top electrode via 332 is disposed over the top electrode 118. A fourth ILD layer 334 is disposed over the third ILD layer 330. In some embodiments, the fourth ILD layer 334 is comprised of an extreme low k dielectric material. A conductive via 336 is disposed over the top electrode via 332. A conductive wire 338 is disposed over the conductive via 336. Sidewalls of the conductive wire 338 extends past sidewalls of the conductive via 336. In some embodiments, the conductive wire 338 and the conductive via 336 comprise copper or aluminum.

Figure 4:
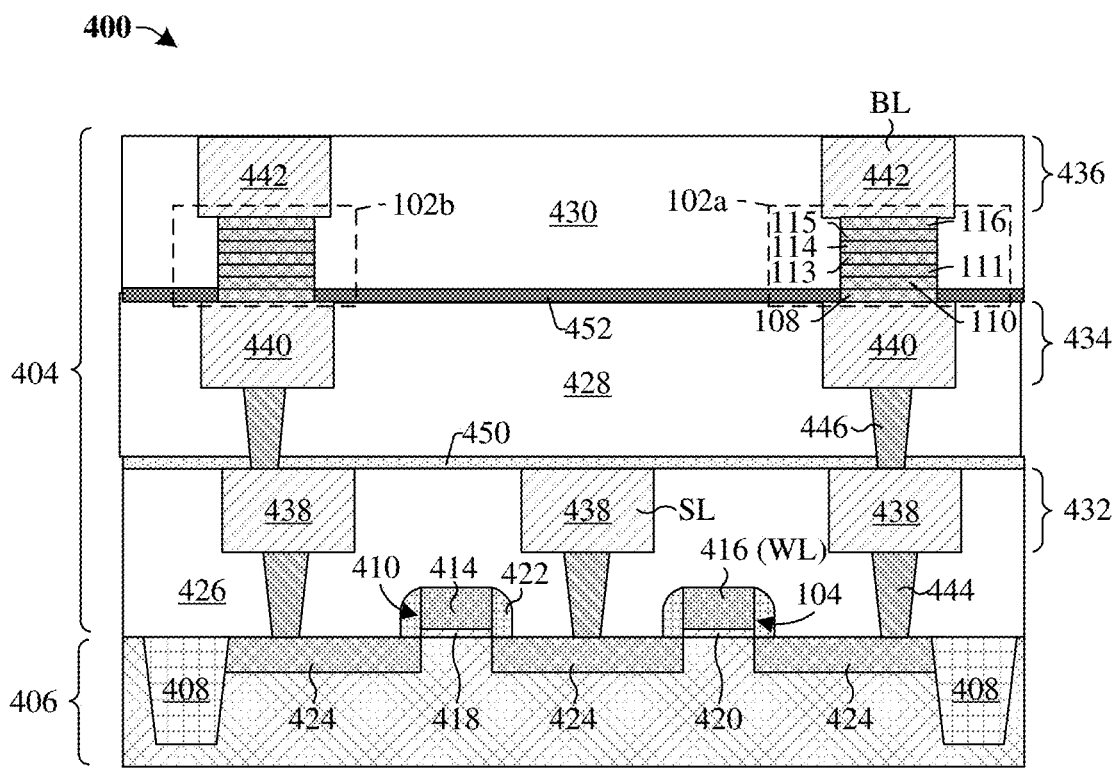
FIG. 4 illustrates a cross-sectional view of some embodiments of a memory device including an MTJ stack, according to the present disclosure.

FIG. 4 illustrates a cross sectional view of some embodiments of an integrated circuit 400, which includes MTJ stacks 102a, 102b disposed in an interconnect structure 404 of the integrated circuit 400. The integrated circuit 400 includes a substrate 406. The substrate 406 may be, for example, a bulk substrate (e.g., a bulk silicon substrate) or a silicon-on-insulator (SOI) substrate. The illustrated embodiment depicts one or more shallow trench isolation (STI) regions 408, which may include a dielectric-filled trench within the substrate 406.

Two access transistors 410, 104 are disposed between the STI regions 408. The access transistors 410, 104 include gate electrodes 414, 416, respectively; gate dielectrics 418, 420, respectively; sidewall spacers 422; and source/drain regions 424. The source/drain regions 424 are disposed within the substrate 406 between the gate electrodes 414, 416 and the STI regions 408, and are doped to have a first conductivity type which is opposite a second conductivity type of a channel region under the gate dielectrics 418, 420, respectively. The gate electrodes 414, 416 may be, for example, doped polysilicon or a metal, such as aluminum, copper, or combinations thereof. The gate dielectrics 418, 420 may be, for example, an oxide, such as silicon dioxide, or a high-K dielectric material. The sidewall spacers 422 can be made of silicon nitride (e.g., $Si_3N_4$), for example.

The interconnect structure 404 is arranged over the substrate 406 and couples devices (e.g., access transistors 410, 104) to one another. The interconnect structure 404 includes a plurality of IMD layers 426, 428, 430, and a plurality of metallization layers 432, 434, 436 which are layered over one another in alternating fashion. The IMD layers 426, 428, 430 may be made, for example, of a low κ dielectric, such as un-doped silicate glass, or an oxide, such as silicon dioxide, or an extreme low κ dielectric layer. The metallization layers 432, 434, 436 include metal lines 438, 440, 442, which are formed within trenches, and which may be made of a metal, such as copper or aluminum. Contacts 444 extend from the bottom metallization layer 432 to the source/drain regions 424 and/or gate electrodes 414, 416; and vias 446 extend between the metallization layers 432, 434, 436. The contacts 444 and the vias 446 extend through dielectric-protection layers 450, 452 (which can be made of dielectric material and can act as etch stop layers during manufacturing). The dielectric-protection layers 450, 452 may be made of an extreme low-κ dielectric material, for example. The contacts 444 and the vias 446 may be made of a metal, such as copper or tungsten, for example. In some embodiments, a metal line in the metal lines 438 may, for example, be electrically coupled to a source line (SL) such that an output of the access transistors 410, 104 may be accessed at the SL.

MTJ stacks 102a, 102b, which are configured to store respective data states, are arranged within the interconnect structure 404 between neighboring metal layers. The MTJ stack 102A includes a buffer layer 108, a seed layer 110 over the buffer layer 108, a hard bias stack 111 over the seed layer 110, a reference layer 113 over the hard bias stack 111, a barrier layer 114 over the reference layer 113, a free layer 115 over the barrier layer 114, and a PMA protection layer 116 over the free layer 115.

FIGS. 5-12 illustrate cross-sectional views 500-1200 of some embodiments of a method of forming a memory device including a MRAM cell comprising an MTJ according to the present disclosure. Although the cross-sectional views 500-1200 shown in FIGS. 5-12 are described with reference to a method, it will be appreciated that the structures shown in FIGS. 5-12 are not limited to the method but rather may stand alone separate of the method. Although FIGS. 5-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
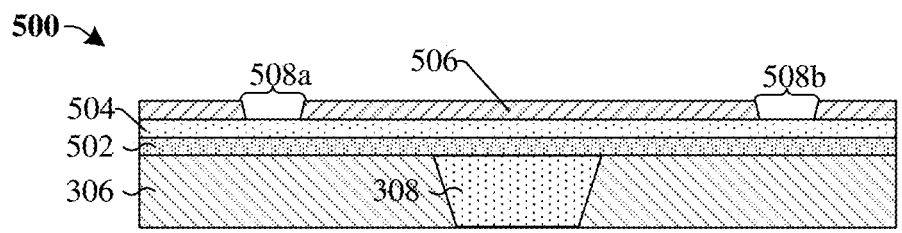
FIGS. 5-9, 10A, 11, and 12 illustrate cross-sectional views of some embodiments of a method of forming a memory device including a MRAM cell having an MTJ element, according to the present disclosure.

As shown in cross-sectional view 500 of FIG. 5, an interconnect via 308 is formed within a second ILD layer 306. A diffusion barrier layer 502 is formed over the second ILD layer 306. A bottom electrode layer 504 is formed over the diffusion barrier layer 502. A masking layer 506 is formed over the bottom electrode layer 504. The masking layer 506 comprises a pair of sidewalls defining one or more holes 508a and 508b above a top surface of the bottom electrode layer 504. In some embodiments, the interconnect via 308 may be comprised of copper or aluminum. In some embodiments, the bottom electrode layer 504 may be comprised of a titanium (Ti) layer, titanium nitride (TiN) layer, tantalum (Ta) layer, or tantalum nitride (TaN) layer. In some embodiments, a buffer film 902 is formed between the bottom electrode layer 504 and the masking layer 506, in such embodiments, the buffer film 902 is not formed at a later step.

Figure 6:
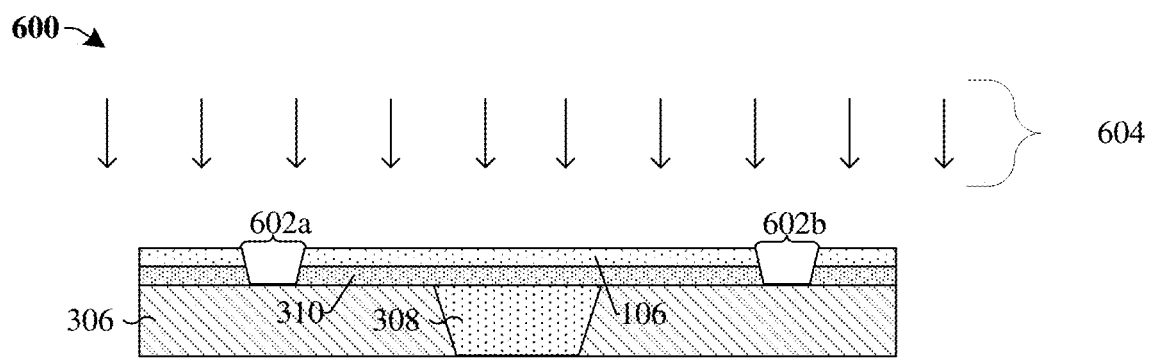

As shown in cross-sectional view 600 of FIG. 6, an etching process is performed to etch the masking layer 506, the bottom electrode layer 504, and the diffusion barrier layer 502. The etching process defines a bottom electrode 106, a diffusion barrier 310, and one or more holes 602a, 602b. In some embodiments, the etching process may be performed by exposing the unmasked areas of the bottom electrode layer 504 and diffusion barrier layer 502 under the one or more holes (508a and 508b of FIG. 5) to an etchant 604. In some embodiments, the diffusion barrier 310 may surround sidewalls of the bottom electrode 106 (not shown).

Figure 7:
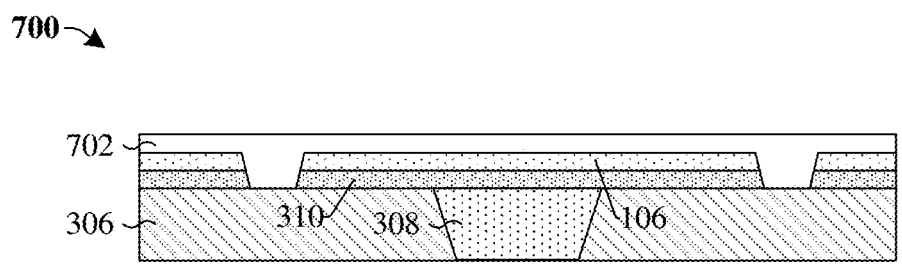

As shown in cross-sectional view 700 of FIG. 7, an insulator layer 702 is formed over the bottom electrode. The insulator layer 702 fills the one or more holes (602a and 602b of FIG. 6).

Figure 8:
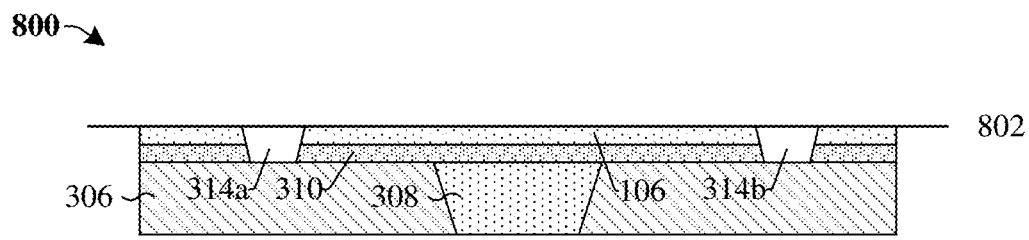

As shown in cross-sectional view 800 of FIG. 8, a chemical mechanical planarization (CMP) process is performed along line 802. The CMP process removes a portion of the insulator layer (702 of FIG. 7). The planarization process defines a first insulator 314a and a second insulator 314b. Sidewalls of the bottom electrode 106 and diffusion barrier 310 are defined by the first insulator 314a and the second insulator 314b.

Figure 9:
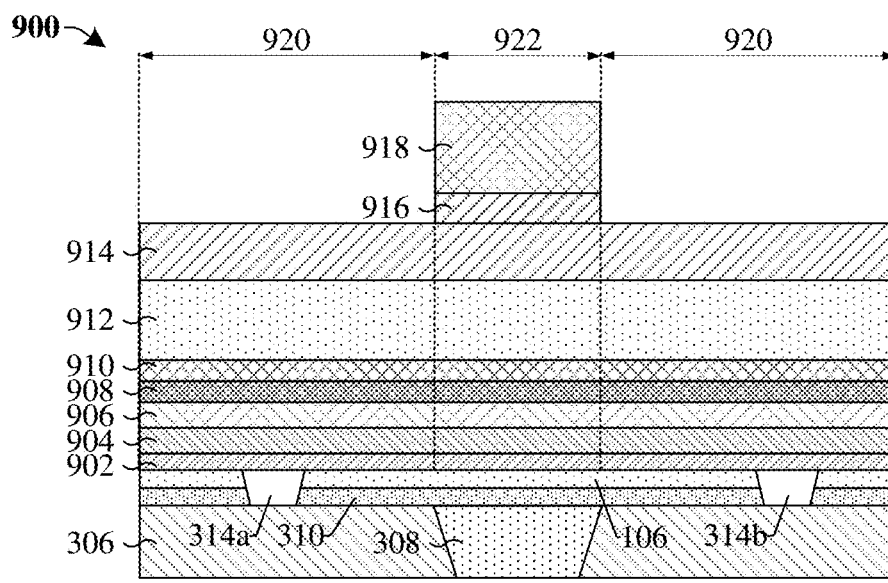

As shown in cross-sectional view 900 of FIG. 9, the buffer film 902 is formed over the bottom electrode 106. A seed film 904 is formed over the buffer film 902. A hard bias film 906 is formed over the seed film 904. AN MTJ layer 908 is formed over the hard bias film 906. The MTJ layer 908 can include a reference layer and a free layer, with a barrier layer separating the reference layer from the free layer. A capping film 910 is formed over the MTJ layer 908. A top electrode layer 912 is formed over the capping film 910. A hard mask layer 914 is formed over the top electrode layer 912. A masking layer 916 and photoresist 918 are formed over the hard mask layer 914. The masking layer 916 and photoresist 918 cover a central region 922 of the hard mask layer 914. The masking layer 916 and photoresist 918 leave a sacrificial portion 920 of an upper surface of the hard mask layer 914 uncovered and exposed.

Figure 10A:
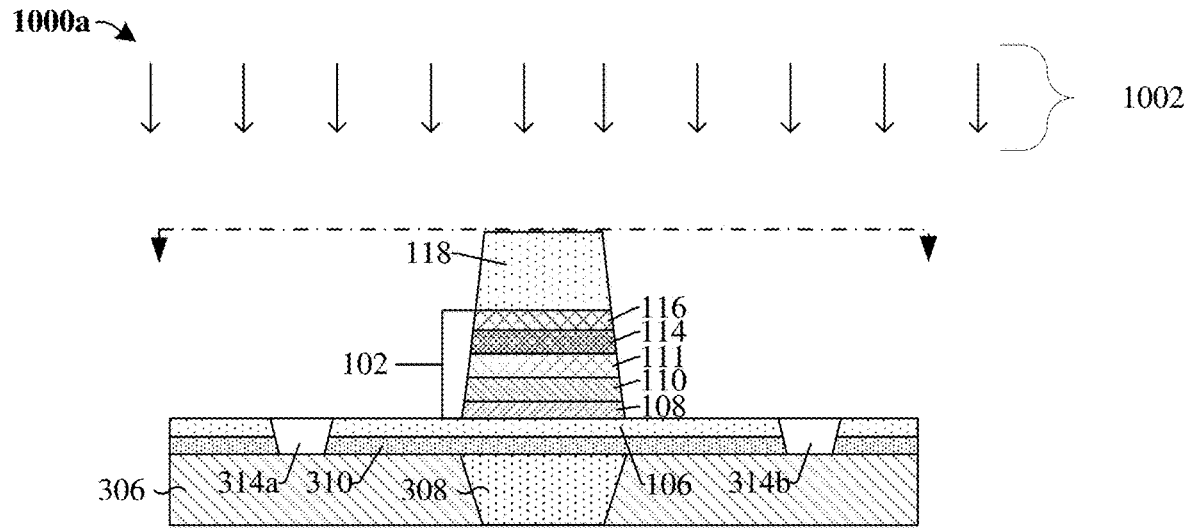

As shown in cross-sectional view 1000a of FIG. 10A, an etching process is performed to etch the buffer film (902 of FIG. 9), the seed film (904 of FIG. 9), the hard bias film (906 of FIG. 9), the MTJ layer (908 of FIG. 9), the capping film (910 of FIG. 9), and the top electrode layer (912 of FIG. 9) respectively defining a buffer layer 108, seed layer 110, hard bias stack 111, MTJ stack 102, PMA protection layer 116, and a top electrode 118. The etching process removes the hard mask layer (914 of FIG. 9), the masking layer (916 of FIG. 9), and the photoresist (918 of FIG. 9). The etching process involves exposing the sacrificial portion (920 of FIG. 9) to an etchant 1002.

An issue during the fabrication of an MTJ device is a re-deposition of metallic bottom electrode 106 materials onto the MTJ device sidewall during MTJ device etch (e.g. etchant 1002), resulting in the bottom electrode 106 of the MTJ device shorting to the top electrode 118. In some embodiments, an MTJ film stack is first deposited from the diffusion barrier 310 and bottom electrode 106 all the way up to the top electrode 118, followed by a hard mask layer (914 of FIG. 9). A photolithography process follows and forms the MTJ film stack pattern. The MTJ film stack is then etched in one step, all the way down to the bottom electrode 106. Using this one-step etch process, the metallic species from the bottom electrode 106 and the diffusion barrier 310 are re-deposited onto the MTJ film stack sidewall, even when the etch process is fully optimized. Furthermore, the bottom electrode 106 and the diffusion barrier 310 often contain tantalum and ruthenium. These are the "sticky" species that have higher sticking coefficient to the sidewall of the MTJ film stack. While most of the metallic species can be removed efficiently during the etch process when the process is optimized, these "sticky" species are much harder to evacuate and tend to "stick" to the sidewall during the etch process causing sidewall re-deposition, that leads to shorting of the top electrode 118 and bottom electrode 106. Embodiments of the current disclosure can be further appreciated that some of the embodiments will help to reduce sidewall re-deposition of the metallic bottom electrode 106 materials. In some embodiments, a two-step etch process is used, in which the bottom electrode 106 and the diffusion barrier 310 are etched and patterned in a first etch step and a following CMP step, while the rest of the MTJ film stack is etched and patterned in a second etched step. In this approach, the sidewall re-deposition of the Ta and Ru in the bottom electrode 106 and the diffusion barrier 310 can be completely avoided, thus eliminating the vast majority of the final re-deposition on the MTJ film stack sidewall. In some embodiments, the two-step process involves first etching the buffer layer 108, bottom electrode 106 and the diffusion barrier 310 then performing a CMP step, while the rest of the MTJ film stack is etched and patterned in the second etched step.

Figure 10B:
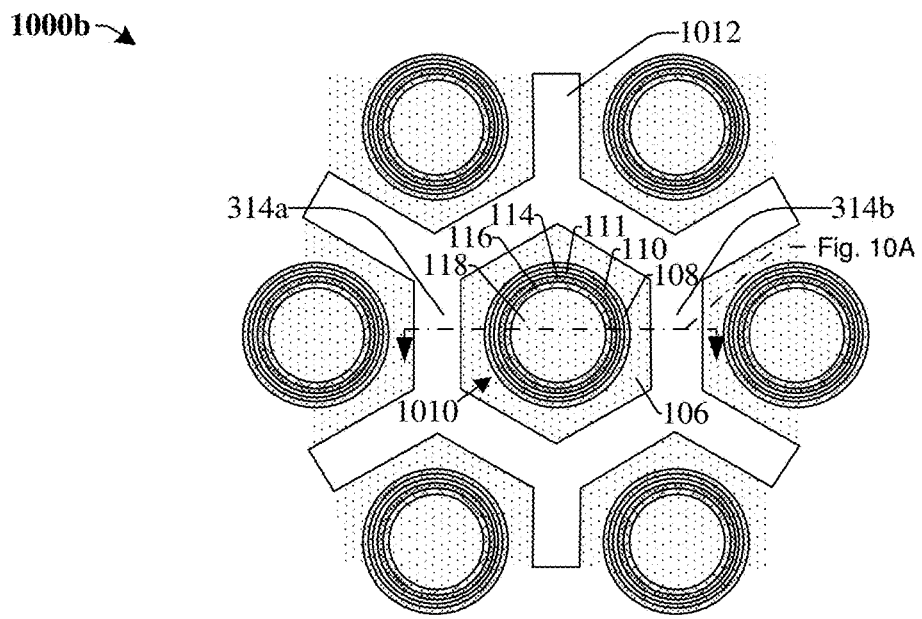
FIG. 10B illustrates a top view of some embodiments of a method of forming a memory device including a plurality of MRAM cells, according to the present disclosure.

FIG. 10B shows a top view 1000b of the cross-sectional view 1000a of FIG. 10A. The dashed line shows where the cross-sectional view 1000a of FIG. 10A is located. FIG. 10B displays a plurality of MRAM cells. The plurality of MRAM cells are arranged in rows and columns. The MRAM cell 1010 includes: the top electrode 118 surrounded by the PMA protection layer 116. The PMA protection layer 116 is surrounded by the MTJ stack 102. The MTJ stack 102 is surrounded by the hard bias stack 111. The hard bias stack 111 is surrounded by the seed layer 110. The seed layer 110 is surrounded by the buffer layer 108. The buffer layer 108 is surrounded by the bottom electrode 106. The bottom electrode 106 is surrounded by the first insulator 314a and the second insulator 314b. The MRAM cell 1010 is surrounded by an insulator 1012 on all sides. The insulator 1012 is disposed between the rows and columns of the plurality of MRAM cells. Thus, as can be appreciated when viewing FIGS. 10A-10B together, while some embodiments may refer to "sidewalls" (plural), this term "sidewalls" can be interpreted from a cross-sectional viewpoint; and when the sidewalls are viewed from above it may be appreciated that the cross-sectional sidewalls are actually a single continuous (e.g., round or elliptical) sidewall in some embodiments.

Figure 11:
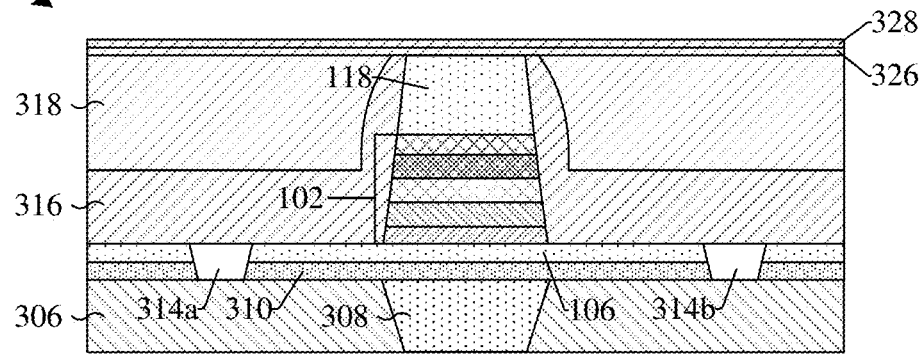

As shown in cross-sectional view 1100 of FIG. 11, a sidewall spacer 316 is formed around the top electrode 118 and over the bottom electrode 106. A second ILD layer 318 is formed over the sidewall spacer 316. A first dielectric layer 326 is formed over the second ILD layer 318. A second dielectric layer 328 is formed over the first dielectric layer 326.

Figure 12:
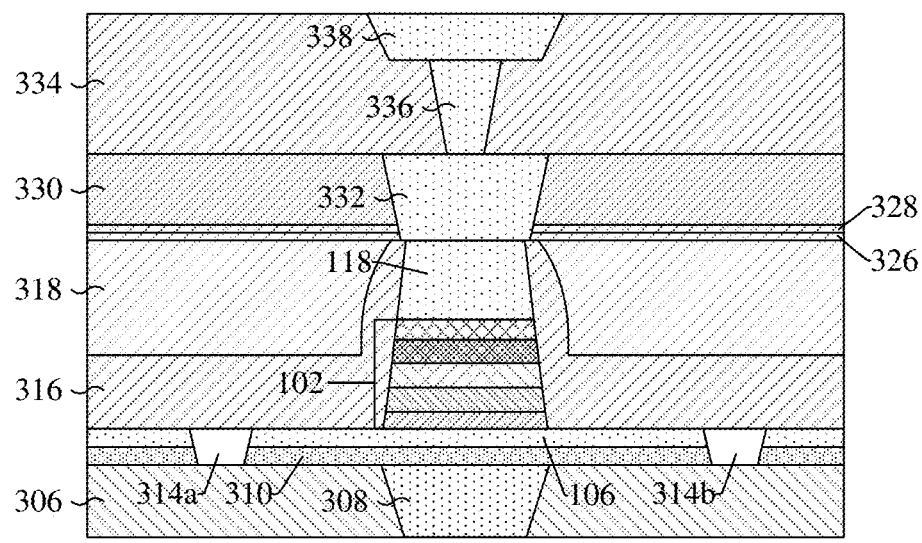

As shown in cross-sectional view 1200 of FIG. 12, a third ILD layer 330 is formed over the second dielectric layer 328. A top electrode via 332 is formed over the top electrode 118. A fourth ILD layer 334 is formed over the third ILD layer 330. A conductive via 336 is formed over the top electrode via 332. A conductive wire 338 is formed over the conductive via 336.

Figure 13:
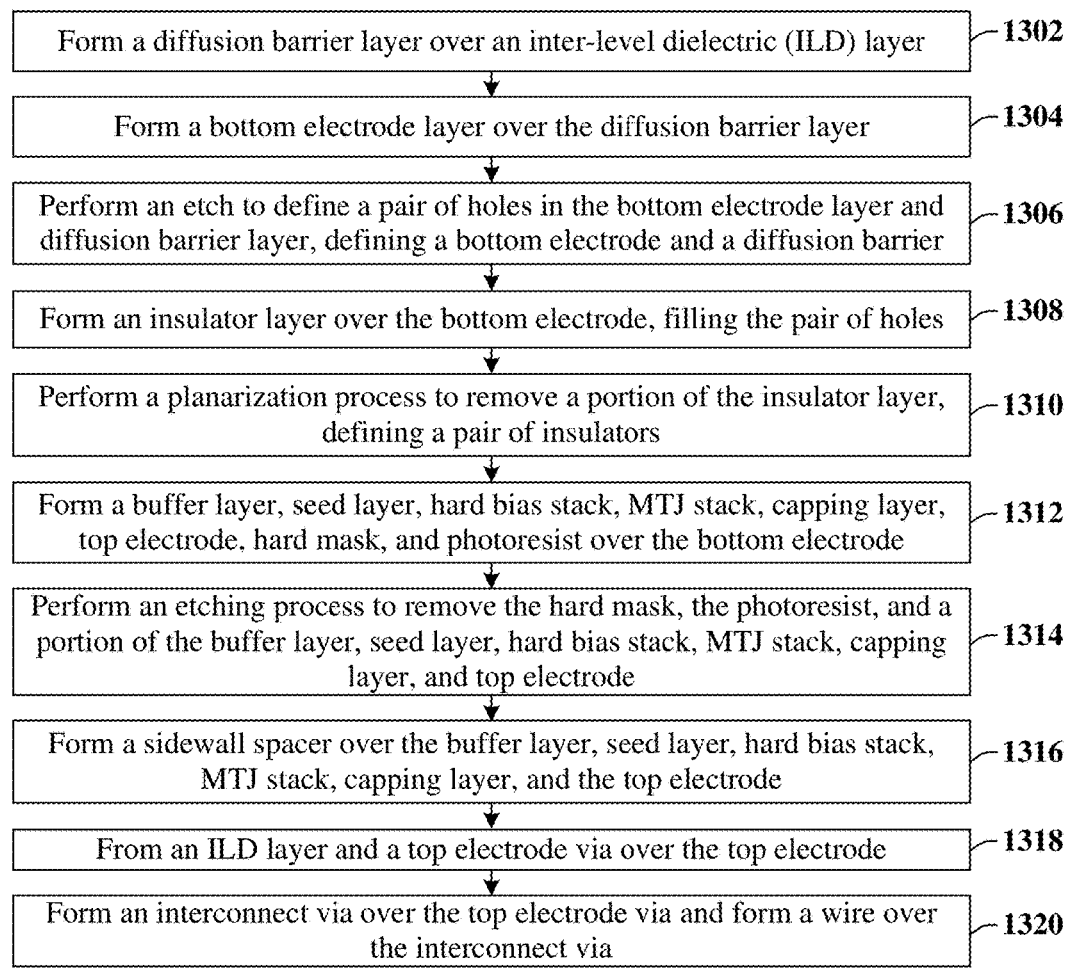
FIG. 13 illustrates a methodology in flowchart format that illustrates some embodiments of a method of forming a memory device including a MRAM cell having an MTJ element, according to the present disclosure.

FIG. 13 illustrates a method 1300 of forming a memory device in accordance with some embodiments. Although the method 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1302, a diffusion barrier layer is formed over an inter-level dielectric (ILD) layer. FIG. 5 illustrates a cross-sectional view 500 corresponding to some embodiments of act 1302.

At 1304, a bottom electrode layer is formed over the diffusion barrier layer. FIG. 5 illustrates a cross-sectional view 500 corresponding to some embodiments of act 1304.

At 1306, an etch process is performed to define one or more holes in the bottom electrode layer and diffusion barrier layer, defining a bottom electrode and a diffusion barrier. FIG. 6 illustrates a cross-sectional view 600 corresponding to some embodiments of act 1306.

At 1308, an insulator layer is formed over the bottom electrode, filling the one or more holes. FIG. 7 illustrates a cross-sectional view 700 corresponding to some embodiments of act 1308.

At 1310, a planarization process is performed to remove a portion of the insulator layer, defining a pair of insulators. FIG. 8 illustrates a cross-sectional view 800 corresponding to some embodiments of act 1310.

At 1312, a buffer layer, seed layer, hard bias stack, MTJ stack, capping layer, top electrode, hard mask and photoresist are formed over the bottom electrode. FIG. 9 illustrates a cross-sectional view 900 corresponding to some embodiments of act 1312.

At 1314, an etching process is performed to remove the hard mask, photoresist, and a portion of the buffer layer, seed layer, hard bias stack, MTJ stack, capping layer, and top electrode. FIG. 10A illustrates a cross-sectional view 1000a corresponding to some embodiments of act 1314.

At 1316, a sidewall spacer is formed over the buffer layer, seed layer, hard bias stack, MTJ stack, capping layer, and the top electrode. FIG. 11 illustrates a cross-sectional view 1100 corresponding to some embodiments of act 1316.

At 1318, an inter-level dielectric (ILD) layer and a top electrode via are formed over the top electrode. FIG. 12 illustrates a cross-sectional view 1200 corresponding to some embodiments of act 1318.

At 1320, an interconnect via is formed over the top electrode via and a wire is formed over the interconnect via. FIG. 12 illustrates a cross-sectional view 1200 corresponding to some embodiments of act 1320.

Accordingly, in some embodiments, the present disclosure relates to a method of forming a MRAM cell disposed between a top electrode and a bottom electrode, the MRAM cell comprising an MTJ element comprising a buffer layer disposed between the bottom electrode and an MTJ stack.

In some embodiments, the present disclosure relates to a memory device. The memory device includes a magnetic tunnel junction (MTJ) device comprising a stack of layers, comprising a bottom electrode disposed over a substrate; a seed layer disposed over the bottom electrode; a buffer layer disposed between the bottom electrode and the seed layer. The buffer layer prevents diffusion of a diffusive species from the bottom electrode to the seed layer.

In other embodiments, the present disclosure relates to a magnetoresistive random-access memory (MRAM) device. The MRAM device comprises a bottom electrode disposed over an interconnect via. A seed layer is disposed over the bottom electrode. A hard bias stack is disposed over the seed layer, and an MTJ stack is disposed over the hard bias stack. The MTJ stack comprises a reference layer, barrier layer, and a free layer. A capping layer is disposed over the MTJ stack, and a buffer layer is disposed between the bottom electrode and the seed layer. The diffusion buffer prevents diffusion of a diffusive species from the bottom electrode to the seed layer, hard bias stack, and MTJ stack.

In yet other embodiments, the present disclosure relates to a method for manufacturing a memory device. The method includes forming a diffusion barrier layer over a substrate. Forming a bottom electrode layer over the diffusion barrier layer. Performing an etch process, defining one or more holes in the bottom electrode layer and diffusion barrier layer and defining a bottom electrode and a diffusion barrier. Forming an insulator layer over the bottom electrode, filling the one or more holes. Performing a planarization process to remove a portion of the insulator layer, defining a pair of insulators. Forming a buffer layer, seed layer, hard bias stack, MTJ stack, capping layer, top electrode, hard mask, and photoresist over the bottom electrode. Performing an etch process to remove the hard mask, the photoresist, and a portion of the buffer layer, seed layer, hard bias stack, MTJ stack, capping layer, and top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
   forming a bottom electrode layer over a substrate;
   performing a first etch process, thereby defining one or more holes in the bottom electrode layer and defining a bottom electrode;

forming a pair of insulators within the one or more holes such that the insulators are disposed on opposing sides of the bottom electrode;

forming a buffer layer, a seed layer, a magnetic tunnel junction (MTJ) stack, and a top electrode over the bottom electrode; and performing a second etch process to remove a portion of the buffer layer, the seed layer, the MTJ stack, and the top electrode, thereby defining a memory cell.

2. The method of claim 1, wherein the first etch process is different from the second etch process.

3. The method of claim 1, wherein the pair of insulators is formed after the first etch process and before the second etch process.

4. The method of claim 1, wherein the buffer layer comprises a Co—Hf film with a Hf content ranging from 18 atomic percentage (at %) to 40 at %.

5. The method of claim 4, wherein the buffer layer is disposed between the seed layer and the bottom electrode.

6. The method of claim 1, wherein the pair of insulators continuously extend from a top surface of the bottom electrode to a point vertically below a bottom surface of the bottom electrode.

7. The method of claim 1, wherein the buffer layer is disposed on a top surface of the bottom electrode and a top surface of the pair of insulators during the second etch process.

8. The method of claim 1, wherein the pair of insulators laterally encloses an outer perimeter of the bottom electrode.

9. A method for manufacturing a memory device, comprising:

forming a bottom electrode over a substrate, wherein forming the bottom electrode comprises forming a bottom electrode layer over the substrate and performing a first etch process on the bottom electrode layer;

forming a buffer layer over the bottom electrode;

forming a seed layer over the buffer layer;

forming a magnetic tunnel junction (MTJ) stack over the seed layer; and wherein the buffer layer comprises a material with a form X—Z, where X is iron (Fe) or cobalt (Co) and Z is hafnium (Hf), yttrium (Y), or Zirconium (Zr) with a Z content ranging from 18 atomic percentage (at %) to 40 at %, wherein forming the buffer layer includes depositing the buffer layer along a top surface of the bottom electrode and performing a second etch process on the buffer layer, and wherein the first etch process is different from the second etch process.

10. The method of claim 9, wherein the material is an amorphous nonmagnetic alloy.

11. The method of claim 9, wherein the buffer layer directly contacts a bottom surface of the seed layer.

12. The method of claim 9, wherein the first etch process is performed on the bottom electrode layer according to a first masking layer and the second etch process is performed on the buffer layer according to a second masking layer different from the first masking layer.

13. The method of claim 9, further comprising:

forming an insulator structure along outer sidewalls of the bottom electrode before forming the buffer layer.

14. The method of claim 13, wherein the insulator structure has an outer perimeter that fully surrounds and is larger than an outer perimeter of the MTJ stack.

15. The method of claim 9, further comprising:

performing a planarization process on the bottom electrode before the second etch process.

16. A method for manufacturing a memory device, comprising:

forming a diffusion barrier layer over a substrate;

forming a bottom electrode layer over the diffusion barrier layer;

performing a first etch process, defining one or more holes in the bottom electrode layer and the diffusion barrier layer, defining a bottom electrode and a diffusion barrier;

forming an insulator layer over the bottom electrode, filling the one or more holes;

performing a planarization process to remove a portion of the insulator layer, defining a pair of insulators;

forming a buffer layer, a seed layer, a hard bias stack, a magnetic tunnel junction (MTJ) stack, a capping layer, a top electrode, a hard mask, and a photoresist over the bottom electrode; and performing a second etch process to remove the hard mask, the photoresist, and a portion of the buffer layer, the seed layer, the hard bias stack, the MTJ stack, the capping layer, and the top electrode.

17. The method of claim 16, further comprising:

forming a sidewall spacer over the top electrode and the bottom electrode;

forming an inter-level dielectric (ILD) layer over the sidewall spacer; and forming a top electrode via over the top electrode.

18. The method of claim 16, wherein the buffer layer is made from an amorphous nonmagnetic binary alloy of form X—Y, where X is Fe or Co and Y is Hf, Y, or Zr.

19. The method of claim 16, wherein the buffer layer prevents diffusion of a diffusive species from the bottom electrode to the seed layer, as well as to aid a planarization of a top surface of the bottom electrode.

20. The method of claim 16, wherein the buffer layer has a substantially flat upper surface and the bottom electrode has a substantially rough upper surface.

* * * * *